United States Patent [19]
Huang

[11] Patent Number: 5,853,927
[45] Date of Patent: Dec. 29, 1998

[54] METHOD OF ALIGNING A MASK IN PHOTOLITHOGRAPHIC PROCESS

[75] Inventor: Chien Chao Huang, Kaohsiung, Taiwan

[73] Assignee: United Microelectronics Corp., Hsinchu, Taiwan

[21] Appl. No.: 842,352

[22] Filed: Apr. 24, 1997

[30] Foreign Application Priority Data

Mar. 24, 1997 [TW] Taiwan ................................. 86103718

[51] Int. Cl.⁶ .................................................. G03F 9/00
[52] U.S. Cl. ............................ 430/22; 356/399; 356/401
[58] Field of Search .............................. 430/22; 356/399, 356/401

[56] References Cited

U.S. PATENT DOCUMENTS 5,552,251  9/1996  Hwang ...................................... 430/22
5,674,650  10/1997  Dirksen et al. ............................ 430/22

FOREIGN PATENT DOCUMENTS 4177348  6/1992  Japan ...................................... 430/22

*Primary Examiner*—Christopher G. Young
*Attorney, Agent, or Firm*—Finnegan, Henderson, Farabow, Garrett & Dunner, L.L.P.

[57] ABSTRACT

A method for aligning a mask in a photolithographic process is provided. This method allows the technician to easily see by the naked eye or by use of a microscope any misalignment of the mask, such that the misalignment can be easily corrected. The method includes providing the mask with an opaque frame having four corners, forming a plurality of alignment patterns on a platform where the mask is to be placed, and performing an alignment of the mask by visually checking for misalignment of the mask with reference to the alignment patterns on the platform. The alignment patterns may include a plurality of parallel-spaced bars both in the crosswise and lengthwise directions, to allow the technician to visually check for any misalignment of the mask and thereby shift the mask pellicle to the aligned position.

20 Claims, 2 Drawing Sheets

METHOD OF ALIGNING A MASK IN PHOTOLITHOGRAPHIC PROCESS

BACKGROUND OF THE INVENTION

1. Field of the Invention

This invention relates to semiconductor fabrication processes, and more particularly, to a method for aligning a mask in a photolithographic process with reference to designed patterns formed by an electron-beam tool.

2. Description of Related Art

The photolithographic process is almost an indispensable step in the fabrication of semiconductor devices. For instance, in the fabrication of MOSFET (metal-oxide semiconductor field-effect transistor) devices, many layers or coatings are selectively removed through the photolithographic process for forming various components in the wafer, such as doping areas. Roughly, the complexity of a semiconductor fabrication process is judged based on the number of photolithographic steps or the number of various masks required for use in the overall fabrication process. Whether the semiconductor fabrication technology can advance to the next generation of a submicron level below 0.25 μm (micrometer) is largely dependent on whether a breakthrough is made in photolithographic techniques.

The main purpose of a photolithographic process is to transfer the circuit layout pattern predefined on a mask onto a photo-sensitive emulsion coated on a semiconductor wafer. A mask is a flat piece of transparent material, such as glass, on which the circuit layout pattern is predefined by forming nontransparent layers, such as chromium layers, to delineate the circuit layout pattern. To prevent reflection, a nonreflective material, such as chromium dioxide, is coated on the chromium layers to a thickness of about 200 Å (angstrom). In the photolithographic process, the circuit layout pattern on the mask can be transferred onto the photo-sensitive emulsion of the wafer by photographic means. It is highly required that the pattern be transferred precisely onto desired positions on the wafer. Thus, the mask should be mounted precisely in position on the platform without any crosswise, lengthwise, or angular misalignments.

SUMMARY OF THE INVENTION

It is therefore a primary objective of the present invention to provide a method for aligning a mask in a photolithographic process which allows the technician to easily see by the naked eye or by use of a microscope any crosswise, lengthwise, or angular misalignment of the mask so that the misalignment can be easily corrected.

In accordance with the foregoing and other objectives of the present invention, a new method for aligning a mask in a photolithographic process is provided. The method includes the following steps of:

(1) providing the mask with an opaque frame having four corners;

(2) forming a plurality of alignment patterns on a platform where the mask is to be placed, wherein the alignment patterns include adjacent first and second bars oriented in a first direction and adjacent third and fourth bars oriented in a second direction perpendicular to the first direction; and (3) performing an alignment of the mask by visually checking for the misalignment of the mask with reference to the alignment patterns on the platform.

The alignment patterns includes a plurality of parallel-spaced first bars and a plurality of parallel-spaced second bars disposed on the platform and oriented in the first direction, and a plurality of parallel-spaced third bars and a plurality of parallel-spaced fourth bars disposed on the platform and oriented in the second direction. Among the first and second bars, at least two of the first bars and two of the second bars are separated by a distance equal to the width of the opaque frame allowing the mask to be positioned by alignment therebetween; and similarly, at least two of the third bars and two of the fourth bars are separated by a distance equal to the width of the opaque frame allowing the mask to be positioned by alignment therebetween.

The alignment patterns are formed by an electron-beam tool and have high position accuracy and critical dimension control, allowing the mask to be mounted precisely in position on the platform. Therefore, the alignment patterns allows the technician to visually align the mask both in the crosswise and lengthwise directions.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Figure 1:
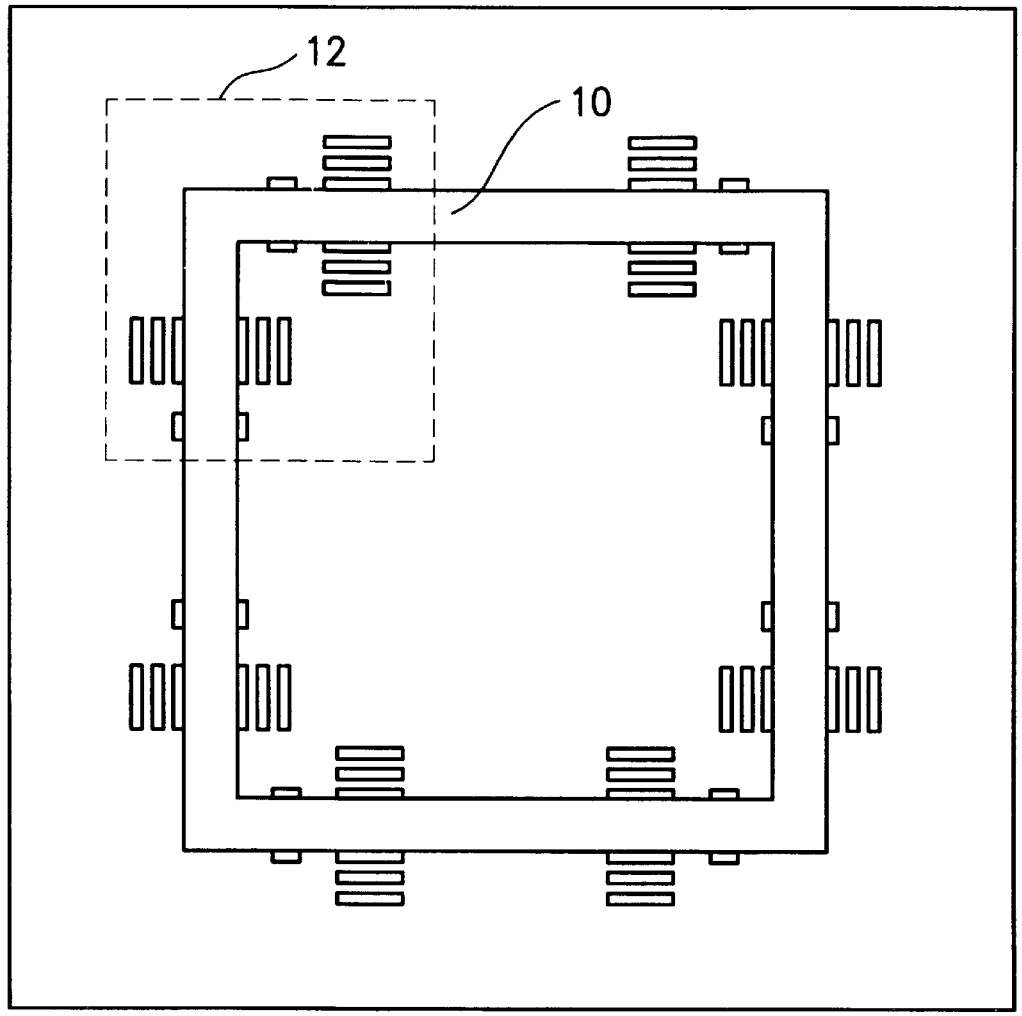
FIG. 1 is a schematic top view of a mask and a plurality of alignment patterns drawn in accordance with the method of the invention.

FIG. 1 is a schematic top view of a mask 10 used in a photolithographic process for transferring a circuit layout pattern onto a photo-sensitive emulsion, or photoresist layer, coated on a semiconductor wafer (not shown). The mask 10 is a transparent piece of glass enclosed in an opaque rectangular frame. On the platform where the mask 10 is to be mounted, a plurality of alignment patterns are formed at predetermined locations, for example corresponding to the four corners of the mask 10, as exemplified by the corner enclosed in a dashed box indicated by the reference numeral 12. These alignment patterns can be formed by engraving with an electron-beam tool. These alignment patterns allow the technician to visually check for any misalignment of the mask 10 with the naked eye or using a microscope and to then make necessary corrections to align the mask 10 precisely in position on the platform. Precise alignment of the mask 10 allows the circuit layout pattern on the mask 10 to be transferred precisely onto the photo-sensitive emulsion coated on the semiconductor wafer.

Figure 2:
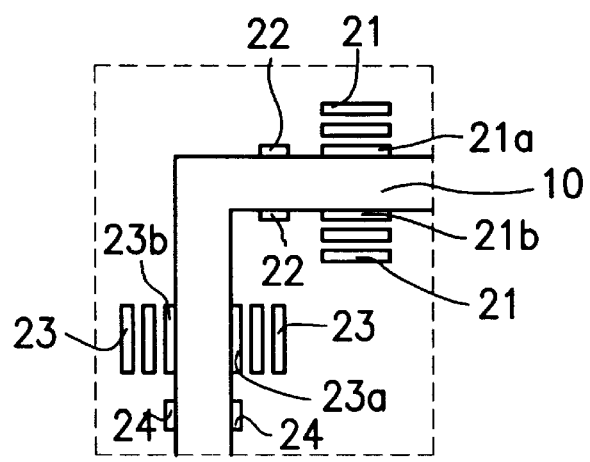
FIG. 2 is an enlarged view of one corner of the mask of FIG. 1.

FIG. 2 shows an enlarged view of the alignment patterns enclosed by the dashed box 12 in FIG. 1. The alignment patterns on the platform are engraved by an electron-beam tool, such as the HL-700MIII or HL-800D electron-beam tool manufactured by the Hitachi Corporation of Japan, which has high position accuracy and critical dimension control. These tools are able to draw the alignment patterns on the platform very quickly in just a few seconds.

As shown, the alignment patterns corresponding to one corner of the mask 10 include a plurality of parallel-spaced first bars 21 and a plurality of parallel-spaced second bars 22. For example, one pair of such markings, which are disposed as shown may be used to allow crosswise alignment of the mask 10. If the mask 10 is aligned in position, two of the first bars 21, as respectively indicated by the reference numerals 21a, 21b, will abut on both sides of the crosswise segment of the frame of the mask 10; and similarly, the two second bars 22 will abut on the same. There are no limitations to the dimensions of the first bars 21, but they should be large enough to be visually perceived with the naked eye or by using a microscope. The second bars 22 are shorter in length than the first bars 21. The total number of the second bars 22 is less than that of the first bars 21.

In a similar manner, the alignment patterns includes a plurality of parallel-spaced third bars 23 and a plurality of parallel-spaced fourth bars 24. For example, one pair of such markings, which are disposed as shown may be used to allow lengthwise alignment of the mask 10. If the mask 10 is aligned in position, two of the third bars 23, as respectively indicated by the reference numerals 23a, 23b, will abut on both sides of the lengthwise segment of the frame of the mask 10; and similarly, the two fourth bars 24 will abut on the same. The fourth bars 24 are shorter in length than the third bars 23. The total number of the fourth bars 24 is less than that of the third bars 23.

Figure 3A:
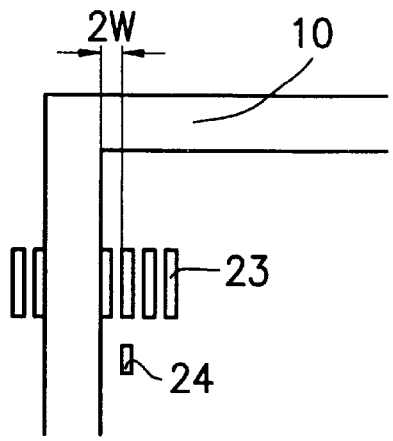
FIG. 3A is a schematic diagram used to depict how a crosswise misalignment of the mask can be corrected.

Referring to FIG. 3A, when the mask 10 is misaligned, for example, in the crosswise direction with a deviation distance of more than 2W, where W is the width of the third bars 23 and of the intervals therebetween, this condition can be easily detected by the naked eye or by use of a microscope. In the case of FIG. 3A, the mask 10 should be shifted to the right until three of the third bars 23 appear on one side of the lengthwise segment of the frame of the mask 10 and the other three of the third bars 23 appear on the other side of the same. This allows the technician to correct the crosswise misalignment of the mask 10 when it is being auto mounted in position on the platform.

Figure 3B:
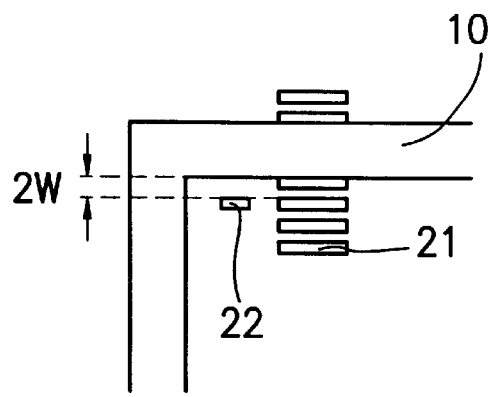
FIG. 3B is a schematic diagram used to depict how a lengthwise misalignment of the mask can be corrected.

Referring to FIG. 3B, when the mask 10 is misaligned, for example in the lengthwise direction, with a deviation distance of more than 2W, where W is the width of the first bars 21 and the intervals therebetween, this condition can be easily detected by the naked eye or by use of a microscope. In the case of FIG. 3B, the mask 10 should be shifted downwards (with reference to the diagram of FIG. 3B) until three of the first bars 21 appear on one side of the crosswise segment of the frame of the mask 10 and the other three of the third bars 23 appear on the other side of the same. This allows the technician to correct the lengthwise misalignment of the mask 10 when it is being auto mounted in position on the platform.

Figure 4:
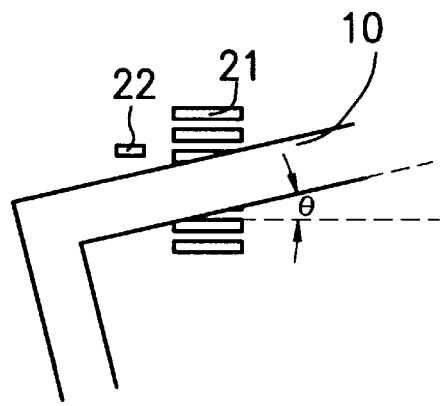
FIG. 4 is a schematic diagram used to depict how an angular misalignment of the mask can be corrected.

Referring further to FIG. 4, when the mask 10 is misaligned angularly, for example by an angle of θ in the counterclockwise direction, this condition can be easily detected by the naked eye or by use of a microscope since the side segment of the frame of the mask 10 is not aligned in parallel with the first bars 21 and second bars 22. In the case of FIG. 4, the mask 10 should be turned clockwise until the side segment of the frame of the mask 10 is aligned in parallel with the first bars 21 and second bars 22. This allows the technician to correct the angular misalignment of the mask 10 when it is being auto mounted in position on the platform.

In conclusion, the invention provides several benefits. First, the alignment patterns are formed by an electron-beam tool with high position accuracy and critical dimension control, allowing the mask to be mounted precisely in position on the platform. Further, the alignment patterns are not limited to the foregoing described patterns; they can be any other pattern that allows the technician to visually align the mask both in the crosswise and lengthwise directions.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for aligning a mask in a photolithographic process, comprising the steps of:
   (1) providing the mask with an opaque frame having four corners;
   (2) forming a plurality of alignment patterns on a platform where the mask is to be placed, wherein the alignment patterns include longitudinally adjacent first and second bars being oriented in a first direction, and longitudinally adjacent third and fourth bars oriented in a second direction perpendicular to the first direction; and
   (3) performing an alignment of the mask by visually checking for misalignment of the mask with reference to the alignment patterns on the platform.

2. The method of claim 1, wherein said alignment patterns further include;
   a plurality of a parallel-spaced first bars and a plurality of parallel-spaced second bars disposed on the platform and oriented in the first direction, wherein at least two of said first bars and two of said second bars are separated by a distance equal to the width of said opaque frame, allowing the mask to be positioned by alignment therebetween; and
   a plurality of parallel-spaced third bars and a plurality of parallel-spaced fourth bars disposed on the platform and oriented in the second direction, wherein at least two of said third bars and two of said fourth bars are separated by a distance equal to the width of said opaque frame, allowing the mask to be positioned by alignment therebetween.

3. The method of claim 2, wherein said first bars are greater in length than the second bars.

4. The method of claim 2, wherein said first bars are greater in number than the second bars.

5. The method of claim 2, wherein said third bars are greater in length than the fourth bars.

6. The method of claim 2, wherein said third bars are greater in number than the fourth bars.

7. The method of claim 2, wherein said first bars are substantially spaced at equal intervals.

8. The method of claim 2, wherein said third bars are substantially spaced at equal intervals.

9. A method for aligning a mask in a photolithographic process, comprising the steps of:
   (1) providing the mask with an opaque frame having four corners;
   (2) forming a plurality of alignment patterns on a platform where the mask is to be placed, said alignment patterns including:
      a plurality of parallel-spaced first bars and a plurality of parallel-spaced second bars disposed on the platform and oriented in a first direction, wherein at least two of said first bars and two of said second bars are separated by a distance equal to the width of said opaque frame, allowing the mask to be positioned by alignment therebetween; and a plurality of parallel-spaced third bars and a plurality of parallel-spaced fourth bars disposed on the platform and oriented in a second direction at a right angle with respect to the first direction, wherein at least two of said third bars and two of said fourth bars are separated by a distance equal to the width of said opaque frames allowing the mask to be positioned by alignment therebetween; and (3) performing an alignment of the mask by visually checking for misalignment of the mask with reference to the alignment patterns on the platform.

10. The method of claim 9, wherein said first bars are greater in length than the second bars.

11. The method of claim 9, wherein said first bars are greater in number than the second bars.

12. The method of claim 9, wherein said third bars are greater in length than the fourth bars.

13. The method of claim 9, wherein said third bars are greater in number than the fourth bars.

14. The method of claim 9, wherein said first bars are substantially spaced at equal intervals.

15. The method of claim 9, wherein said third bars are substantially spaced at equal intervals.

16. A method for aligning a mask in a photolithographic process comprising the steps of:

(1) providing the mask with an opaque frame having four corners;

(2) forming a plurality of alignment patterns on a platform where the mask is to be placed, said alignment patterns including:

at least two parallel spaced first bars and at least two parallel spaced second bars disposed on the platform in oriented in a first direction, wherein in the at least two said first bars and the at least two said second bars are separated by a distance equal to the width of said opaque frame, allowing the mask to be positioned by alignment between two of the first bars and two of the second bars; and (3) performing an alignment of the mask by visually checking for misalignment of the mask with reference to the alignment patterns of the platform.

17. The method of claim 16, wherein said alignment patterns further include at least two parallel spaced third bars and at least two parallel spaced fourth bars disposed on the platform and oriented in a second direction perpendicular to the first direction, wherein the at least two said third bars and the at least fourth bars are separated by distance equal to the width of said opaque frame allowing the mask to be positioned by alignment therebetween.

18. The method of claim 17, wherein the aligning step includes visually checking for misalignment of the mask with reference to both the first and second bars and the third and fourth bars.

19. The method of claim 16, wherein said first bars are greater number than said second bars.

20. The method of claim 17, wherein said first bars are greater number than said second bars and wherein said third bars are greater number than said fourth bars.

* * * * *